US012647742B2

(12) United States Patent
Breebaart et al.

(10) Patent No.: US 12,647,742 B2
(45) Date of Patent: Jun. 2, 2026

(54) DOLBY ATMOS MASTER COMPRESSOR/LIMITER

(71) Applicant: DOLBY LABORATORIES LICENSING CORPORATION, San Francisco, CA (US)

(72) Inventors: Dirk Jeroen Breebaart, North Sydney (AU); Brett G. Crockett, Brisbane, CA (US); Ryan Michael Friedrich, San Francisco, CA (US); Jordan Robert Glasgow, Oakland, CA (US); Derek Christian Jones, Concord, CA (US); Eric Whelan Yeargan, Los Angeles, CA (US)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 184 days.

(21) Appl. No.: 18/281,535

(22) PCT Filed: Mar. 24, 2022

(86) PCT No.: PCT/US2022/021696
§ 371 (c)(1),
(2) Date: Sep. 11, 2023

(87) PCT Pub. No.: WO2022/250772
PCT Pub. Date: Dec. 1, 2022

(65) Prior Publication Data
US 2024/0163529 A1      May 16, 2024

Related U.S. Application Data

(60) Provisional application No. 63/194,359, filed on May 28, 2021.

(51) Int. Cl.
*H04S 3/00* (2006.01)
*G10L 19/008* (2013.01)
(Continued)

(52) U.S. Cl.
CPC ............ *H04S 3/008* (2013.01); *G10L 19/008* (2013.01); *G11B 27/031* (2013.01); *H03G 9/005* (2013.01);
(Continued)

(58) Field of Classification Search
CPC ... H04S 3/008; H04S 2400/13; G10L 19/008; G11B 27/031; H03G 9/005; H04N 21/8106; H04N 21/8456; H04N 21/854
See application file for complete search history.

(56) References Cited

U.S. PATENT DOCUMENTS 7,391,875 B2 * 6/2008 Shashoua ............... H03G 7/002
381/104
8,195,318 B2 6/2012 Oh
(Continued)

FOREIGN PATENT DOCUMENTS

JP        2017511048 A      4/2017
RU        2735652 C2      11/2020
(Continued)

OTHER PUBLICATIONS

US 10,930,293 B2, 02/2021, Kuech (withdrawn)
(Continued)

*Primary Examiner* — Carolyn R Edwards
*Assistant Examiner* — Kuassi A Ganmavo

(57) ABSTRACT

The present disclosure relates to a method and audio processing system for performing dynamic range adjustment of spatial audio objects. The method comprises obtaining (step S1) a plurality of spatial audio objects (10), obtaining (step S2) at least one rendered audio presentation of the spatial
(Continued)

audio objects (10) and determining (step S3) signal level data associated with each presentation audio channel in said set of presentation audio channels. The method further comprises obtaining (step S31) a threshold value and, for each time segment, selecting (step S4) a selected presentation audio channel which is associated with a highest or a lowest signal level, determining (step S5) a gain based on the threshold value and the representation of the signal level of the selected audio channel, and applying (step S6) the gain of each time segment to corresponding time segments of the spatial audio objects.

18 Claims, 6 Drawing Sheets

(51) Int. Cl.

| | |
|---|---|
| *G11B 27/031* | (2006.01) |
| *H03G 9/00* | (2006.01) |
| *H04N 21/81* | (2011.01) |
| *H04N 21/845* | (2011.01) |
| *H04N 21/854* | (2011.01) |

(52) U.S. Cl.
CPC ..... *H04N 21/8106* (2013.01); *H04N 21/8456* (2013.01); *H04N 21/854* (2013.01); *H04S 2400/13* (2013.01)

(56) References Cited

U.S. PATENT DOCUMENTS

| | | | | |
|---|---|---|---|---|
| 8,488,811 | B2 | 7/2013 | Smithers | |
| 8,504,376 | B2 | 8/2013 | Kim | |
| 9,350,312 | B1 | 5/2016 | Wishnick | |
| 9,559,650 | B1* | 1/2017 | Skovenborg | H03G 7/002 |
| 9,559,651 | B2 | 1/2017 | Baumgarte | |
| 9,576,585 | B2 | 2/2017 | Bleidt | |
| 9,787,266 | B2 | 10/2017 | Oh | |
| 10,063,207 | B2 | 8/2018 | Malak | |
| 10,419,867 | B2 | 9/2019 | Seo | |
| 10,607,615 | B2 | 3/2020 | Paulus | |
| 10,956,121 | B2 | 3/2021 | Koppens | |
| 2003/0081804 | A1* | 5/2003 | Kates | H04R 25/356 |
| | | | | 381/316 |
| 2004/0213420 | A1* | 10/2004 | Gundry | H03G 9/10 |
| | | | | 381/104 |
| 2009/0274310 | A1* | 11/2009 | Taenzer | H03G 9/025 |
| | | | | 381/57 |

| | | | | |
|---|---|---|---|---|
| 2010/0080397 | A1 | 4/2010 | Suzuki | |
| 2010/0153120 | A1 | 6/2010 | Shirakawa | |
| 2011/0009987 | A1* | 1/2011 | Seefeldt | H03G 7/007 |
| | | | | 700/94 |
| 2011/0013790 | A1* | 1/2011 | Hilpert | G10L 19/173 |
| | | | | 381/1 |
| 2012/0308049 | A1* | 12/2012 | Schreiner | H04S 3/008 |
| | | | | 381/119 |
| 2015/0371649 | A1* | 12/2015 | Crockett | G10L 19/025 |
| | | | | 704/500 |
| 2016/0225376 | A1 | 8/2016 | Honma | |
| 2016/0293177 | A1* | 10/2016 | Chebiyyam | G10L 19/26 |
| 2017/0032793 | A1* | 2/2017 | Baumgarte | G10L 19/008 |
| 2017/0098452 | A1 | 4/2017 | Tracey | |
| 2018/0213342 | A1 | 7/2018 | Geiger | |
| 2018/0218742 | A1* | 8/2018 | Baumgarte | H04S 3/008 |
| 2018/0227691 | A1* | 8/2018 | Chen | G10L 19/008 |
| 2019/0028827 | A1* | 1/2019 | Ward | H03G 7/007 |
| 2019/0306652 | A1 | 10/2019 | Robinson | |
| 2020/0322743 | A1* | 10/2020 | Cengarle | H04S 3/008 |
| 2020/0364025 | A1* | 11/2020 | Riedmiller | G06F 3/165 |
| 2020/0374649 | A1 | 11/2020 | Hestermann | |
| 2020/0382892 | A1 | 12/2020 | Mehta | |
| 2021/0005211 | A1 | 1/2021 | Stahlmann | |
| 2021/0084426 | A1 | 3/2021 | Chung | |

FOREIGN PATENT DOCUMENTS

| | | |
|---|---|---|
| WO | 2020187807 A1 | 9/2020 |
| WO | 2021007246 A1 | 1/2021 |

OTHER PUBLICATIONS

Cengarle Giulio et al: "A Clipping Detector for Layout-Independent Multichannel Audio Production", AES Convention 132; Apr. 2012, AES, Apr. 26, 2012, XP040574563, pp. 1-8.

Jouni Paulus, "Parameter Domain Loudness Estimation in Parametric Audio Object Coding," 2018 26th European Signal Processing Conference (EUSIPCO) Date of Conference: Sep. 3-7, 2018, pp. 1-5.

Robert Bleidt et al., "Object-Based Audio: Opportunities for Improved Listening Experience and Increased Listener Involvement," Oct. 20-23, 2014, SMPTE 2014 Annual Technical Conference & Exhibition Date of Conference: Oct. 20-23, 2014 Date Added to IEEE Xplore: Oct. 24, 2015, pp. 1-20.

Robert L. Bleidt, "Development of the Mpeg-H Tv Audio System for ATSC 3.0," Mar. 2017, IEEE Transactions on Broadcasting (vol. 63, Issue: 1, Mar. 2017) pp. 202-236 Date of Publication: Mar. 8, 2017.

\* cited by examiner

DOLBY ATMOS MASTER COMPRESSOR/LIMITER

CROSS REFERENCE TO RELATED APPLICATIONS

The present application is the U.S. National Stage of International Application No. PCT/US2022/021696, filed Mar. 24, 2022, which claims priority to U.S. Provisional Application No. 63/194,359, filed on May 28, 2021, each of which is incorporated by reference in its entirety.

TECHNICAL FIELD OF THE INVENTION

The present invention relates to a method for performing dynamic range adjustment of spatial audio objects and an audio processing system employing the aforementioned method.

BACKGROUND OF THE INVENTION

In the field of audio mastering, a mastering engineer typically receives a rendered audio presentation and performs e.g. equalization or other forms of audio processing to make it suitable for playback on a target playback system, such as a set of headphones or a home theatre audio system. For instance, if the audio presentation is a high quality stereo signal recorded in a professional recording studio, the mastering engineer may need to modify the dynamic range or equalization of the high quality stereo signal to obtain a mastered stereo signal that is better suited for low bitrate digitalization and/or playback via simple stereo devices such as a headset.

Different forms of peak limiters are used in the mastering process and especially in the mastering of music to ensure that the audio signals of the rendered presentation do not exceed a peak threshold. Also, the use of a peak limiter is an effective tool to change the dynamic range or other properties of the audio signals of the rendered presentation that will influence how the mastered presentation is perceived by the end user.

In a similar fashion, audio compressors are used in the mastering process to implement either upward and/or downward compression of the rendered presentation audio signals. For instance, a downward audio compressor will apply an attenuation to an audio signal with a signal level above a predetermined threshold wherein the applied attenuation increases e.g. linearly with the signal level exceeding the threshold value. Accordingly, compressors will typically ensure that a higher signal level leads to an introduction of more aggressive attenuation and vice versa for expanders.

With the introduction of object-based audio content, which is represented with a plurality of audio objects, the same object-based audio content can be rendered to a large number of different presentations such as a stereo presentation or multichannel representations such as a 5.1 or 7.1 presentation. While this enables a flexibility in terms of rendering the same audio content to different presentations while simultaneously offering an enhanced spatial audio experience, this flexibility introduces problems for audio mastering. As the presentation to which the object-based audio is to be rendered is not predetermined, there exists no single presentation on which a peak limiter or compressor of the mastering process can be applied.

GENERAL DISCLOSURE OF THE INVENTION

A drawback of the proposed methods for mastering object-based audio content is that the process is in general not lossless and may introduce undesirable audio artifacts at other presentations than the single presentation which has been mastered. Additionally, prior proposed methods for mastering object-based audio content do not allow the mastering engineer to audition the result of the mastering process in substantially real time, and furthermore, the mastering engineer is only able work on one predetermined presentation of the object-based audio at a time. If, for example, the mastering engineer were to create a mastered stereo presentation and a mastered 5.1 presentation of the same spatial audio content, the mastering engineer would need to perform two separate mastering processes one after another for each of the two different presentations.

These drawbacks of existing techniques for performing audio mastering brings a cumbersome and repetitive workflow when mastering object-based audio content while, at the same time, the resulting mastered object-based audio content may still feature undesirable audio artifacts in presentation formats other than the select few presentation formats analyzed by the mastering engineer.

It is therefore a purpose of the present disclosure to provide an enhanced method and audio processing system for performing dynamic range adjustment of spatial audio objects.

According to a first aspect of the invention there is provided method for performing dynamic range adjustment of spatial audio objects. The method comprises obtaining a plurality of spatial audio objects, obtaining a threshold value and obtaining at least one rendered audio presentation of the spatial audio objects wherein the at least one rendered audio presentation comprises at least one presentation audio channel forming a set of presentation audio channels. The method further comprises determining signal level data associated with each presentation audio channel in the set of presentation audio channels wherein the signal level data represents the signal level for a plurality of time segments of the presentation audio channel and, for each time segment, selecting a selected presentation audio channel being a presentation audio channel of the set of presentation audio channels which is associated with a highest/lowest signal level for the time segment compared to the other presentation audio channels of the set of presentation audio channels. With the selected presentation channel the method further comprises determining again, the gain being based on the threshold value and the representation of the signal level of the selected audio channel and applying the gain of each time segment to corresponding time segments of each spatial audio object to form dynamic range adjusted spatial audio objects.

With a gain it is meant at modification of the signal amplitude and/or power level. It is understood that the modification may relate to either an increase or decrease in signal amplitude and/or power level. That is, the term 'gain' covers both an amplification gain, meaning increase an in amplitude and/or power, and an attenuation, meaning decrease in amplitude and/or power. To highlight this the broad term 'gain' will in some instances be referred to as an 'attenuation and/or gain' or an 'attenuation/gain'.

That is, the method involves pinpointing the highest/lowest signal level for each time segment across all presentation channels in the set of presentation channels and determining an attenuation/gain based on the highest/lowest signal level of each time segment and the threshold value. The determined attenuation/gain is applied to corresponding time segments of each of the plurality of spatial audio objects to from dynamic range adjusted spatial audio objects which in turn may be rendered to an arbitrary presentation format.

Determining an attenuation/gain may comprise determining an attenuation/gain to realize at least one of: a peak limiter, a bottom limiter (the opposite of a peak limiter), an upward compressor, a downward compressor, an upward expander, a downward expander and smoothed versions thereof. In some implementations, the threshold value is obtained together with a ratio indicating the amount of attenuation/gain to be applied for signal levels being above/below the threshold value. Moreover, the attenuation/gain may be based on additional signal levels in addition to the highest/lowest signal level.

For instance, the attenuation/gain may be based on a combination, such as a weighted average, of the signal levels of each time segment of all presentation channels or the two, three, four or more highest/lowest presentation audio channels in each time segment. In such implementations, the step of selecting a presentation channel is replaced with a step of calculating for each time segment the average signal level for all presentation channels in the set of presentation channels whereby the attenuation gain is based on the average signal level and the obtained threshold value.

The invention is at least partially based on the understanding that by selecting a highest/lowest presentation channel and determining an attenuation/gain based on the signal level of the selected presentation channel dynamic range adjusted spatial audio objects may be created which will include the dynamic range adjustments for any presentation format to which they are rendered. In addition, the method described in the above facilitates an efficient workflow for mastering engineers working with spatial audio objects as the adjusted spatial audio objects may be rendered to any number of presentation formats at the same time as the dynamic range adjustments are performed allowing the mastering engineer to audition the adjustments and easily switch between presentation formats during the mastering process.

In some implementations, at least two rendered presentations are obtained wherein each rendered audio presentation comprises at least one presentation audio channel. Accordingly, the step of selecting a presentation channel may occur across presentation audio channels of two or more different presentations. For instance, the attenuation/gain may be further based on a representation of the signal level of a second selected presentation channel wherein the second selected presentation channel is of a different rendered presentation than the selected audio channel. As explained in the above, more than one signal level may be combined wherein the combination of two or more signal levels is used to determine the attenuation gain.

A distinctly different method enabling mastering of object-based audio content is disclosed in WO2021007246 which relates to rendering the audio content to a single presentation and allowing a mastering engineer or mastering process to perform audio processing on the single presentation to form a mastered presentation. By comparing the mastered presentation with the original presentation the differences between the mastered presentation and the original presentation may be extracted, wherein object-based audio content is subject to a mastering process based on the determined differences.

BRIEF DESCRIPTION OF THE DRAWINGS

The present invention will be described in more detail with reference to the appended drawings, showing currently preferred embodiments of the invention.

DETAILED DESCRIPTION OF CURRENTLY PREFERRED EMBODIMENTS

Figure 1:
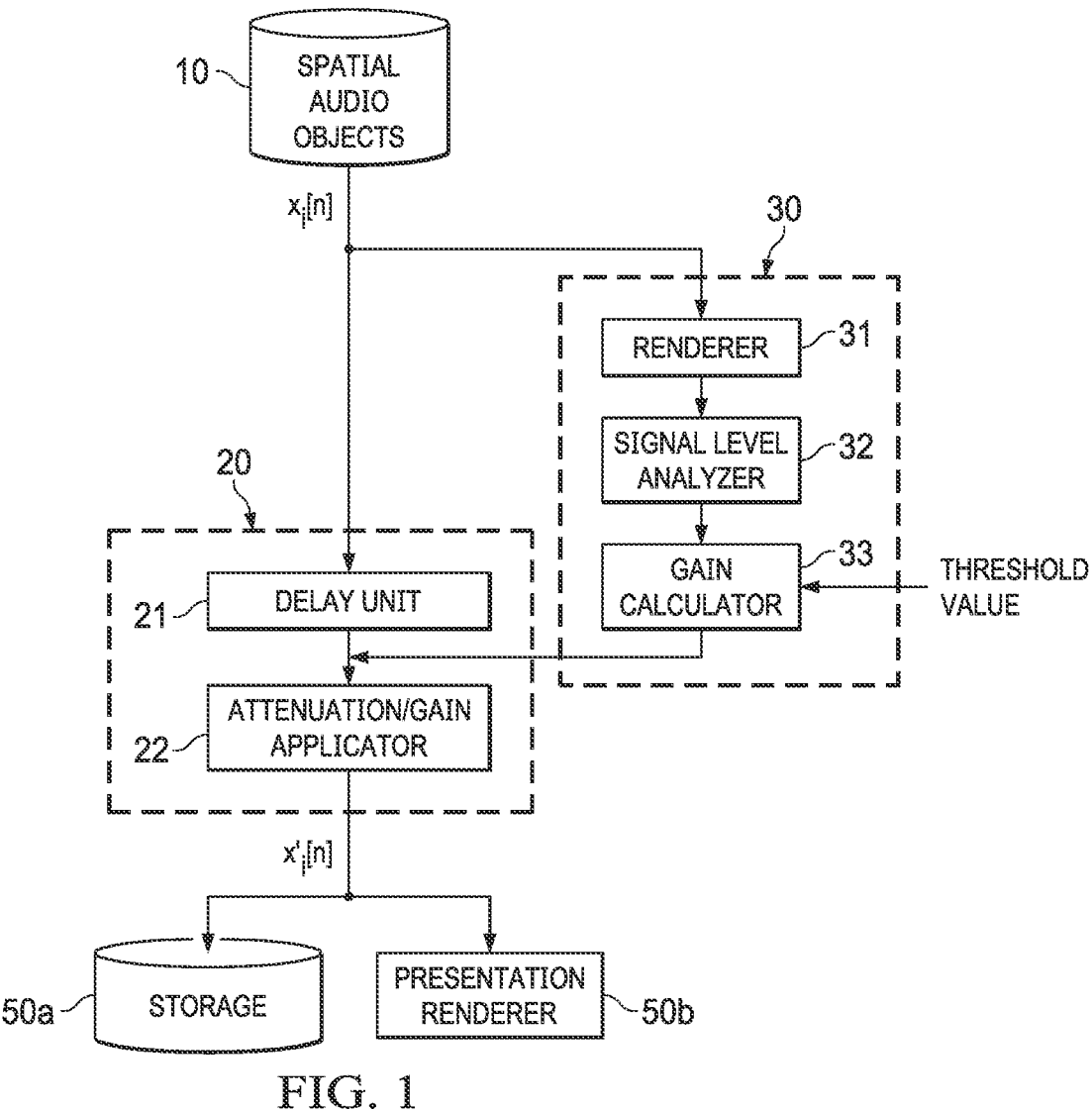
FIG. 1 is a block diagram illustrating an audio processing system for performing dynamic range adjustment of spatial audio objects, according to some implementations.

Systems and methods disclosed in the present application may be implemented as software, firmware, hardware or a combination thereof. In a hardware implementation, the division of tasks does not necessarily correspond to the division into physical units; to the contrary, one physical component may have multiple functionalities, and one task may be carried out by several physical components in cooperation.

The computer hardware may for example be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions (sequential or otherwise) that specify actions to be taken by that computer hardware. Further, the present disclosure shall relate to any collection of computer hardware that individually or jointly execute instructions to perform any one or more of the concepts discussed herein.

Certain or all components may be implemented by one or more processors that accept computer-readable (also called machine-readable) code containing a set of instructions that when executed by one or more of the processors carry out at least one of the methods described herein. Any processor capable of executing a set of instructions (sequential or otherwise) that specify actions to be taken are included. Thus, one example is a typical processing system (i.e. a computer hardware) that includes one or more processors. Each processor may include one or more of a CPU, a graphics processing unit, and a programmable DSP unit. The processing system further may include a memory subsystem including a hard drive, SSD, RAM and/or ROM. A bus subsystem may be included for communicating between the components. The software may reside in the memory subsystem and/or within the processor during execution thereof by the computer system.

The one or more processors may operate as a standalone device or may be connected, e.g., networked to other processor(s). Such a network may be built on various different network protocols, and may be the Internet, a Wide Area Network (WAN), a Local Area Network (LAN), or any combination thereof.

The software may be distributed on computer readable media, which may comprise computer storage media (or non-transitory media) and communication media (or transitory media). As is well known to a person skilled in the art, the term computer storage media includes both volatile and non-volatile, removable and non-removable media implemented in any method or technology for storage of information such as computer readable instructions, data structures, program modules or other data. Computer storage media includes, but is not limited to, physical (non-transitory) storage media in various forms, such as EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media (transitory) typically embodies computer readable instructions, data structures, program modules or other data in a modulated data signal such as a carrier wave or other transport mechanism and includes any information delivery media.

An audio processing system for dynamic range adjustment according to some implementations will be discussed with reference to FIG. 1 and FIG. 2.

The plurality of spatial audio objects 10 comprises a plurality of audio signals associated with a (dynamic) spatial location. The spatial location may be represented using metadata which is associated with the plurality of audio signals, wherein the metadata e.g. indicates how an audio object (audio signal) moves in a three-dimensional space. A collection of spatial audio objects 10 is referred to as an object-based audio asset. The object-based audio asset comprises e.g. 2, 10, 20 or more spatial audio objects such as 50 or 100 spatial audio objects with time varying positions indicated by the associated spatial metadata.

At step S1 the spatial audio objects 10 are obtained and provided to a side-chain 30 of the audio processing system comprising at least one renderer 31, a signal level analyzer 32 and a gain calculator 33. At step S2 the renderer 31 renders the audio objects 10 to a predetermined audio presentation comprising at least one presentation audio channel forming a set of presentation audio channels. The predetermined audio presentation may e.g. be set by the mastering engineer or set by a preset audio presentation of the renderer 31. In another example, the predetermined audio presentation may be set by the type of audio content represented by the spatial audio objects 10 (such as music, speech or movie audio track).

For instance, the renderer 31 renders the spatial audio objects to at least one presentation chosen from a group consisting of: a mono presentation (one channel), a stereo presentation (two channels), a binaural presentation (two channels), a 5.1 presentation (six channels), a 7.1 presentation (eight channels), a 5.1.2 presentation (eight channels), a 5.1.4 presentation (ten channels), a 7.1.2 presentation (ten channels), a 7.1.4 presentation (twelve channels), a 9.1.2 presentation (twelve channels), a 9.1.4 presentation (fourteen channels), a 9.1.6 presentation (sixteen channels) and a multichannel presentation with at least three height levels (such as a 22.2 presentation with 24 channels and three height levels located above, at and below ear level). It is noted that these presentations are merely exemplary and that the renderer 31 may render the spatial audio objects to one or more arbitrary presentation with an arbitrary number of presentation channels.

In some implementations, each presentation comprises at least two presentation audio channels meaning that the renderer 31 is be configured to render the spatial audio objects to a presentation selected from the group mentioned in the above excluding the mono presentation alternative (one channel).

The presentation audio channel(s) and the audio signals of each of the spatial audio objects 10 is represented with a sequence of time segments. The time segments may be individual samples, frames, groups of two or more frames or a predetermined time portion of the audio channels. Moreover, the time segments could be partially overlapping such that the time segments e.g. are 10 ms frames with a 30% overlap.

The renderer 31 receives the spatial audio objects $x_i[n]$, with audio object index i and time segment index n, and computes presentation channels $s_{j,k}[n]$, with presentation index j and speaker feed index k based on metadata ML[n] for object index i. Each presentation comprises at least one presentation audio channel which is intended for playback using a speaker with an associated speaker feed index k. For example, for a stereo presentation k=1, 2 and a first presentation audio channel (the left stereo channel) is associated with the speaker feed signal with index k=1 and a second presentation audio channel (the right stereo channel) is associated with the speaker feed signal with index k=2. In some implementations, only one presentation is used and thus index j can be omitted as there is only one presentation with k speaker feeds (presentation channels). The renderer 31 converts (potentially time-varying) metadata Mi[n] into a potentially time-varying rendering gain vector $g_{i,k}[n]$ for each object index i and speaker feed index k to compute the presentation channels $s_{j,k}[n]$ in accordance with $$s_{j,k}[n] = \Sigma_i x_i[n] g_{i,k}[n] \qquad \text{(Eq. 1)}$$

wherein the conversion from metadata Mi[n] to rendering gain vector $g_{i,k}[n]$ in general depends on the desired output presentation format. In general, renderer 31 performs the rendering of the spatial audio objects 10 (i.e., $x_i[n]$) to presentation channels $s_{j,k}[n]$ in a frequency variant manner. For example, when rendering the spatial audio objects 10 to a binaural presentation format with two presentation channels, the mapping of the spatial audio objects 10 to each respective binaural channel will be frequency dependent, taking e.g. a frequency dependent head-related transfer function (HRTF) into consideration. In another example, the audio presentation is intended for playback using speakers with different properties meaning that the renderer 31 may emphasize some frequencies for certain speaker feeds (presentation channels). It is investigated that for presentations intended for playback on e.g. low performance audio equipment the high and/or low frequency content of the spatial audio objects 10 may be suppressed. Also, it is investigated that for e.g. a 5.1 presentation low frequency content of the spatial audio objects 10 may be rendered to the LFE channel whereas high frequency is emphasized for the center, left and/or right channel. However, in some simple cases, the renderer 31 performs the rendering in a frequency invariant manner.

In many cases, although not all cases, the number of spatial audio objects 10 is greater than the number of speaker feeds k.

At step S3 the presentation audio channels of the rendered presentation are provided to a signal level analyzer 32 which first determines signal level data associated with each presentation audio channel in the set of presentation audio channels. The signal level data indicates at least one representation or measure of the signal level of each time segment of each presentation channel wherein the signal level data e.g. is at least one of: an RMS representation of the signal level/power of the time segment, an amplitude/power of the time segment, a maximum amplitude/power of the time segment, and an average amplitude/power of the time segment. The signal level data may be determined using any appropriate method and in a simple case where each presentation audio signal is represented as time domain waveform samples the signal level data is merely the amplitude (signal) level of each sample. In another example, where the presentation audio channels are represented with a series of (potentially overlapping) frequency domain frames the signal level may be determined as a function of the spectral energy of each frame.

Furthermore, the signal level analyzer 32 determines, using the signal level data, the maximum or minimum signal level, max[n] or min[n] for each time segment which occurs among the set of presentation audio signals. Alternatively, the signal level analyzer 32 determines an average signal level avg[n] for at least two presentation channels, (e.g., such as all presentation channels) wherein the average signal level avg[n] may be a weighted average. It is understood that while first determining the signal level data and subsequently determining the maximum, minimum, or average signal level, max[n], min[n], avg[n] using the signal level data is described as two sub-steps the maximum, minimum, or average signal level, max[n], min[n], avg[n] may be determined directly from the presentation audio channels as a single step.

At step S4 a presentation audio channel is selected for each time segment among the set of presentation audio channels. For instance, the presentation channel associated with the maximum max[n] or minimum min[n] signal level is selected by the signal level analyzer 32. Alternatively, step S4 may comprise determining, with the signal level analyzer 32, the average signal level avg[n] for at least two presentation audio channels. For instance, using the average signal level avg[n] may lead to dynamic range adjusted spatial audio objects which are less aggressively compressed or expanded (while potentially allowing some presentations channels to be above or below a target upper signal level or target lower signal level). Using the maximum max[n] or minimum min[n] signal level is effective for ensuring that no presentation channel is above or below a target upper signal level or target lower signal level (while the compression or expansion is aggressive and may lead to artifacts not present when using the average signal level avg[n]).

At step S5 the attenuation/gain calculator 33 determines the attenuation or gain based on the signal level of the selected presentation signal (or the average signal level of two or more presentation signals) and outputs information indicative of the determined attenuation or gain to an attenuation/gain applicator unit 22.

In some implementations, step S5 involves the gain calculator 33 comparing the signal level obtained from the signal level analyzer 32 (e.g. max[n], min[n] or avg[n]) with the obtained threshold value and calculates an attenuation which reduces the peak value max[n] to the threshold value or a gain which increases the minimum signal value min[n] to the threshold value. That is, the attenuation/gain calculator 33 may be configured to calculate a gain or attenuation for performing at least one of upwards peak limiting and downward peak limiting to adjust the dynamic range of the spatial audio objects 10.

In another implementation, step S5 involves the gain calculator 33 comparing the min[n] or avg[n] signal level obtained at step S4 with the obtained threshold value and if the min[n] or avg[n] signal level is below the threshold value the gain calculator the gain calculator 33 indicates that the time segment should be attenuated (e.g. completely silenced). For instance, such a gain calculator may be used to implement downward expansion such as completely silencing any time segment having an associated signal level below the threshold value.

At step S6 the attenuation/gain applicator unit 22 applies the attenuation/gain to corresponding time segments of each spatial audio object 10 to form dynamic range adjusted spatial audio objects $x'_i[n]$. The attenuation/gain applicator unit 22, together with the optional delay unit 21, forms a main processing chain 20 which processes the spatial audio objects (e.g. applies a gain or attenuation) in a manner which is controlled by the side-chain 30.

In some implementations, the threshold value obtained at S31 is accompanied by an adjustment ratio coefficient indicating the attenuation/gain to be applied for signal levels being above/below the threshold value. Accordingly, the attenuation/gain calculated by the gain calculator 33 may act as a compressor or expander wherein the adjustment ratio is a ratio such as 1:2, 1:3, 1:4 or in general 1:x wherein $x \in (1, \infty)$. It is understood that an adjustment ratio of 1:∞ would correspond to a peak or bottom limiter. For instance, step S31 comprises obtaining an adjustment ratio coefficient and step S5 comprises determining, with the attenuation/gain calculator 33, a threshold difference, the threshold difference being the difference between the peak threshold value and the signal level representation of the selected audio channel and determining the limiting the attenuation/gain based on the threshold difference weighted with the adjustment ratio coefficient. The threshold value and/or adjustment ratio may be based on a desired input/output curve which e.g. is created by the user.

The dynamic range adjusted spatial audio objects $x'_i[n]$ created by application of the attenuation/gain by the attenuation/gain applicator 22 may be archived, encoded, distributed or rendered for direct audition. For instance, the dynamic range adjusted spatial audio objects $x'_i[n]$ may be provided to a storage unit 50a or transmitted to at least one presentation renderer 50b, such as, for example, a headphones speaker renderer (a stereo renderer) or a 7.1.4 speaker renderer. Any other type of presentation render may also be used and are within the scope of this disclosure.

It is noted that while the spatial audio objects have been rendered to a predetermined nominal presentation by the renderer 31, the spatial audio objects 10 may be rendered to a large number of different presentations suitable for different speaker or headphones setups. Even though the dynamic range adjusted spatial audio objects $x'_i[n]$ were obtained by analysis of a select few rendered presentations (such as one rendered presentation), the dynamic range adjustments of the dynamic range adjusted spatial audio objects $x'_i[n]$ will accomplish dynamic range adjustment even when the dynamic range adjusted spatial objects $x'_i[n]$ are rendered to presentations other than the select few presentations used in the analysis.

For instance, the side-chain 30 renders the spatial audio objects to a 5.1.2 presentation comprising five ear-height speaker feeds, one Low-Frequency Effects (LFE) signal, and two overhead speaker feeds on which the signal level analyzer 32 and gain calculator 33 operates. The resulting time-varying attenuation/gain is applied to corresponding time segments of the spatial audio objects 10 in the attenuation/gain applicator 22 to obtain dynamic range adjusted spatial audio objects x'$_i$[n]. The dynamic range adjusted spatial audio objects x'$_i$[n] could in turn be stored in storage 50a or rendered by presentation renderer 50b to any presentation (including the 5.1.2 presentation) such as a 2.0 presentation or a 7.1.4 presentation which will feature the dynamic range adjustments.

In some implementations, the audio processing system further comprises a delay unit 21 configured to form a delayed version of the spatial audio objects 10. The delay introduced by the delay unit 21 may be a delay corresponding to the delay introduced by the renderer 31, signal level analyzer 32 and/or gain calculator 33 of the side-chain 30. The delay introduced by the renderer 31 may vary greatly depending on the presentation format output by the renderer. For time-domain renderers the delay may be very short such as zero or tens of samples while transform-based renderers (which e.g. are used to render binaural audio signals for headphones) may have a longer delay ranging from hundreds to thousands of samples, such as ranging from 500 to 2000 samples.

Figure 3:
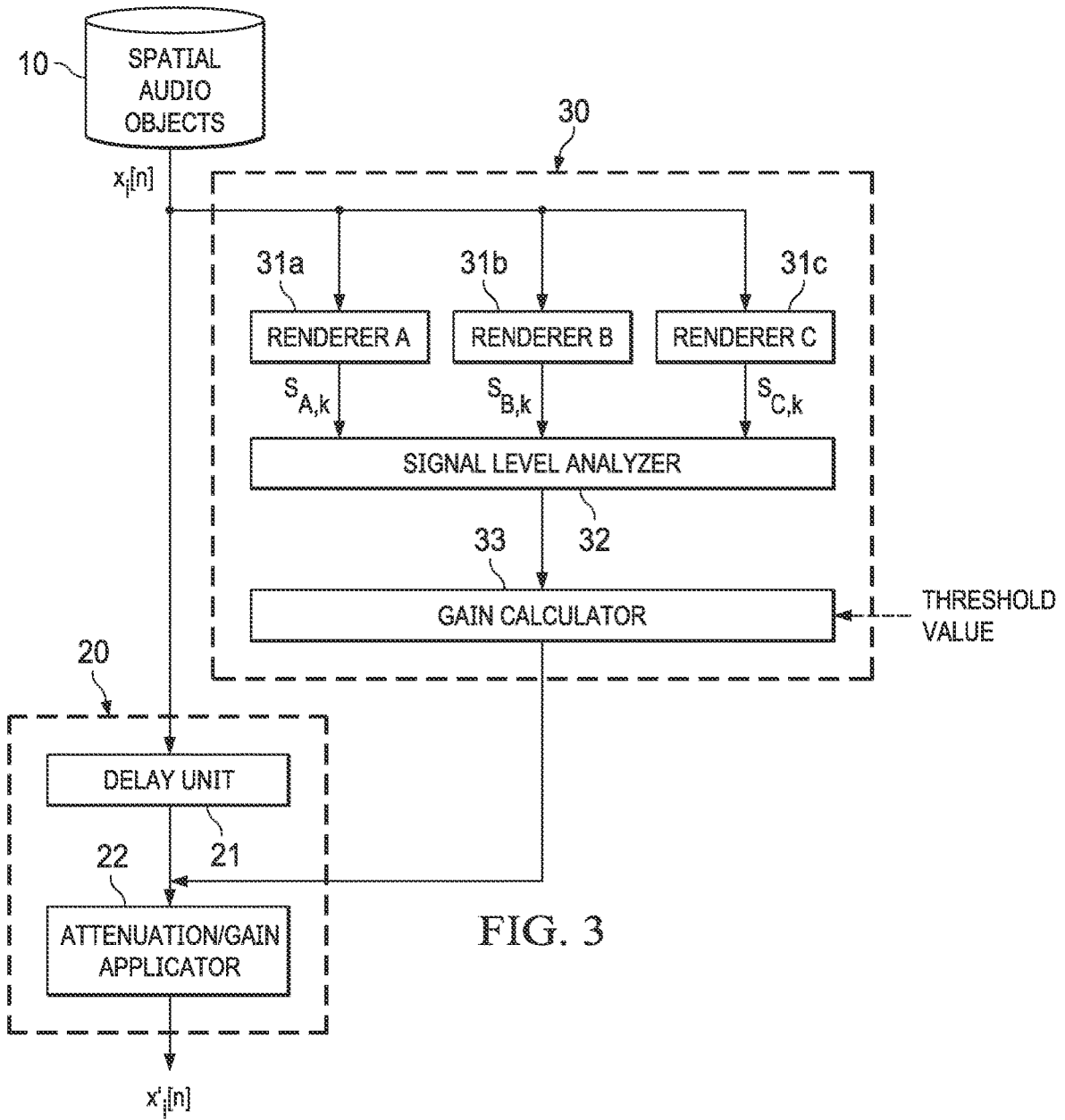
FIG. 3 is a block diagram illustrating an audio processing system for performing dynamic range adjustment of spatial audio objects with three renderers, each renderer rendering the spatial audio objects to a different rendered presentation, according to some implementations.

FIG. 3 illustrates an audio processing system for performing dynamic range adjustment of spatial audio objects 10 according to some implementations. As seen, the side-chain 30 of the audio processing system comprises at least two renderers, such as three renderers 31a, 31b, 31c, wherein each renderer 31a, 31b, 31c is configured to obtain the plurality of spatial audio objects 10 and render the spatial audio objects to a respective rendered presentation, each rendered presentation comprising at least one presentation audio channel forming the set of presentation audio channels. Accordingly, the signal level analyzer 32 performs the signal level analysis across more than one presentation. For example, when determining the max[n], min[n] or avg[n] signal level, the signal level analyzer 32 determines max[n], min[n] or avg[n] across all presentation channels in the set of presentation channels which comprises channels from two or more rendered presentations.

In some implementations, the signal level analyzer 32 determines max[n], min[n] or avg[n] across all presentation channels in a subset of comprising at least two of the presentation channels in the set of presentation channels. For instance, the signal level analyzer 32 may select the maximum or minimum signal level mix[n], min[x] in each presentation and determine the average of the selected the maximum or minimum signal levels mix[n], min[x].

For example, renderer A 31a renders the spatial audio objects 10 to a stereo presentation (s$_{A,k}$ with k=1, 2), renderer B 31b renders the spatial audio objects 10 to a 5.1 (s$_{B,k}$ with k=1, 2 . . . 6) presentation and renderer C 31c renders the spatial audio objects 10 to a 7.1.4 presentation (s$_{C,k}$ with k=1, 2 . . . 12). In this example, the signal level analyzer 32 performs the analysis (e.g. determination of max[n], min[n] or avg[n]) over 2+6+12=20 channels from three different rendered presentations.

While the embodiment depicted in FIG. 3 has three renderers 31a, 31b, 31c any number of renderers may be used as an alternative to the three renderers 31a, 31b, 31c, such as two renders or at least four renderers. Moreover, while the renderers 31a, 31b, 31c are depicted as separate renderers the two or more rendered audio presentation may be obtained by a single renderer configured to renderer the spatial audio objects 10 to two or more presentations.

The attenuation/gain calculator 33 determines an attenuation/gain for each time segment and provides the determined attenuation/gain to the main-chain 20 for application to corresponding time segments of the spatial audio objects 10.

In some implementations, the same threshold value is used for each of the at least two presentations s$_{A,k}$, s$_{B,k}$, s$_{C,k}$. In other implementations, an individual threshold value is obtained for each of the at least two presentations wherein the attenuation/gain is based on a selected presentation audio channel and threshold value of each presentation. The threshold value may thus be set globally, for all presentations, individually, for each presentation, or per subset of presentations. For instance, one subset may include presentations intended for playback using headphones or earphones whereas another subset includes presentations intended for playback using loudspeakers in a surround system.

For example, the gain calculator 33 calculates an attenuation/gain based on the selected presentation audio channel and threshold level of a first presentation combined with the selected presentation audio channel and threshold level of a second presentation. Combining the selected presentation audio channel and threshold level of the at least two presentation audio channels may e.g. comprise calculating the average (or a weighted average) of an attenuation/gain calculated for each of the presentation. For instance, when calculating an attenuation for enabling downward compression the gain calculator 33 compares the signal level of the selected audio channel with the first threshold value and determines that a first attenuation A$_1$ is required for compression of the first presentation. Similarly, the gain calculator 33 determines that a second attenuation A$_2$ is required for compression of the second presentation whereby the signal calculator 33 calculates a combination (such as e.g. the average or a weighted average) of the first and second attenuation A$_1$, A$_2$ which is applied by the attenuation/gain applicator 22.

The threshold value of each presentation may be determined from a single obtained threshold value by e.g. taking the downmixing of the spatial audio objects in each presentation into account.

In some implementations (not shown), each renderer 31a, 31b, 31c is associated with an individual signal level analyzer 32 and/or individual gain calculator 33. For instance, each renderer 31a, 31b, 31c is associated with an individual signal level analyzer 32 which outputs the signal level min[n], max[n], avg[n] to a common gain calculator 33. Furthermore it is envisaged that each renderer 31a, 31b, 31c is associated with an individual signal level analyzer 32 and individual gain calculator 33 whereby the gains of the individual gain calculators 33 are combined (e.g. by means of an average, weighted average, minimum selection, maximum selection) such that the combined gain is provided to the attenuation/gain applicator 22.

Figure 4:
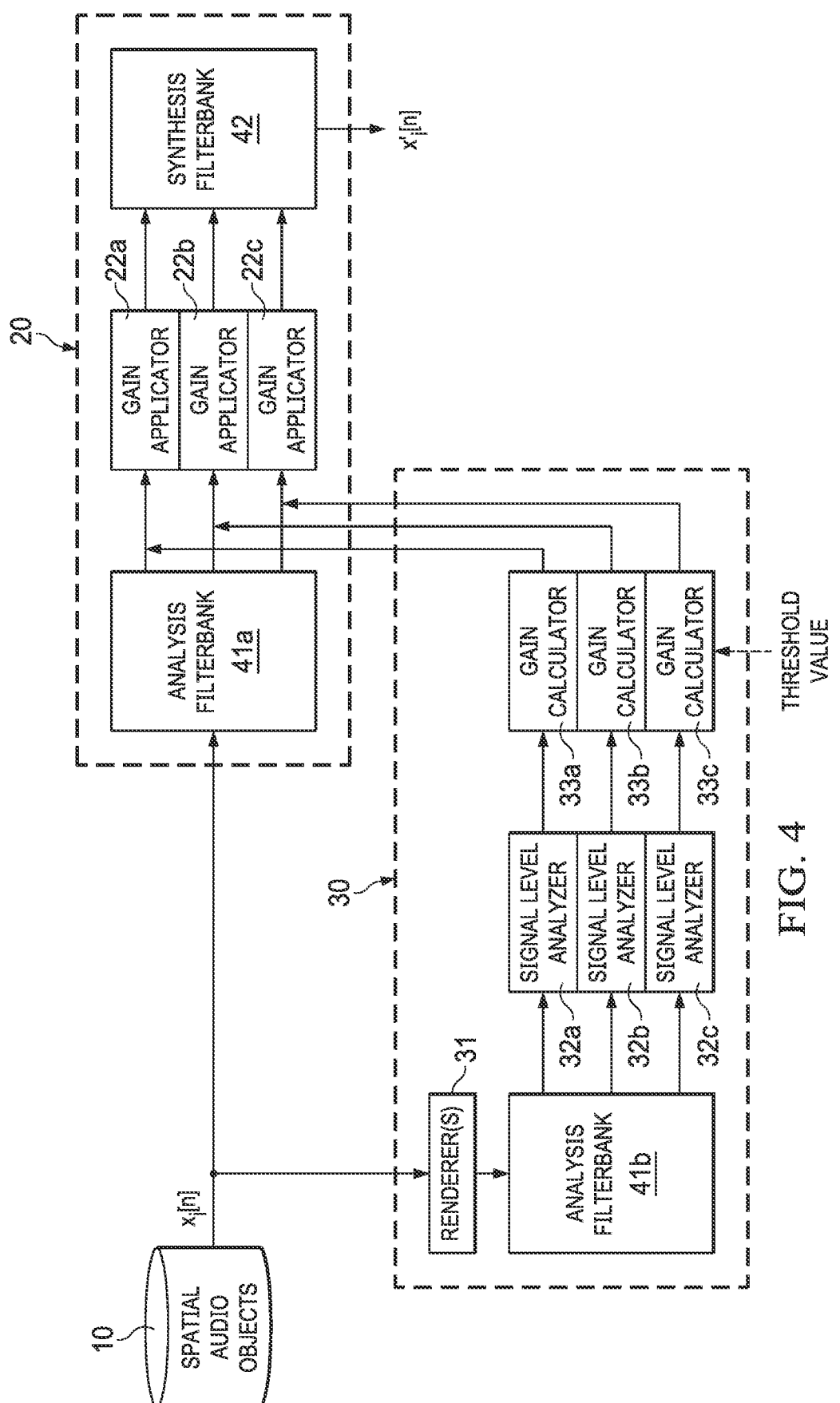
FIG. 4 is a block diagram illustrating an audio processing system for performing dynamic range adjustment of spatial audio objects in different subband representations extracted by an analysis filterbank, according to some implementations.

FIG. 4 illustrates an audio processing system for performing dynamic range adjustment of spatial audio objects 10 according to some implementations. In the side-chain 30, the spatial audio objects 10 are provided to at least one renderer 31 to form one or several rendered audio presentations. Each rendered audio presentation is provided to an analysis filterbank 41b in the side-chain 30 which extracts at least two subband representations of each rendered audio presentation. In the depicted embodiment, the analysis filterbank 41b extracts three subband representations of each rendered presentation outputted by the at least one renderer 31, but two or at least four subband representations may be used in an analogous manner. For each subband representation, an individual signal level analyzer 32a, 32b, 32c and gain calculator 33a, 33b, 33c is provided to determine a respective attenuation/gain to be applied to corresponding time segments and subband representations of the spatial audio objects 10. To this end, an analysis filterbank 41a is used to extract corresponding subband representations of the spatial audio objects 10.

In the main-chain 20, an individual attenuation/gain applicator 22a, 22b, 22c (one for each subband representation) obtains the subband representation of the spatial audio objects and the calculated gain by the gain calculators 33a, 33b, 33c to form dynamic range adjusted subband representations of the spatial audio objects. Lastly, a synthesis filterbank 42 is used to combine the dynamic range adjusted subband representations of the spatial audio objects to a single set of dynamic range adjusted spatial audio objects which are stored or provided to an arbitrary presentation renderer.

The signal level analyzer 32a, 32b, 32c and gain calculator 33a, 33b, 33c of each subband representation may be equivalent to the signal level analyzer 32 and gain calculator 33 described in other parts of this application. That is, the step of selecting a highest/lowest presentation channel or determining an average signal for each time segment is performed in parallel for each subband representation. Similarly, an attenuation/gain is determined for each subband representation and applied by the respective attenuation/gain applicator 22a, 22b, 22c.

Furthermore, the same threshold value is used for each subband representation or, alternatively, different threshold values are obtained for each subband representation. Additionally, the side-chain parameters and output renderer parameters described in connection to FIG. 6 in the below may be the same across all subband representations or defined individually for each subband representation.

It is understood that while the multiple renderers of FIG. 3 and multiple frequency bands of FIG. 4 are respectively depicted as separate audio processing systems they may form part of the same system. For example, an audio processing system comprising two or more renderers 31 wherein at least two signal level analyzers 32a, 32b, 32c are operating on different subband representations of each presentation is considered one implementation. Additionally, it is understood that the main-chain 20 may comprise one or more delay units to introduce a delay for compensating for any delay introduced by the side-chain 30.

Figure 2:
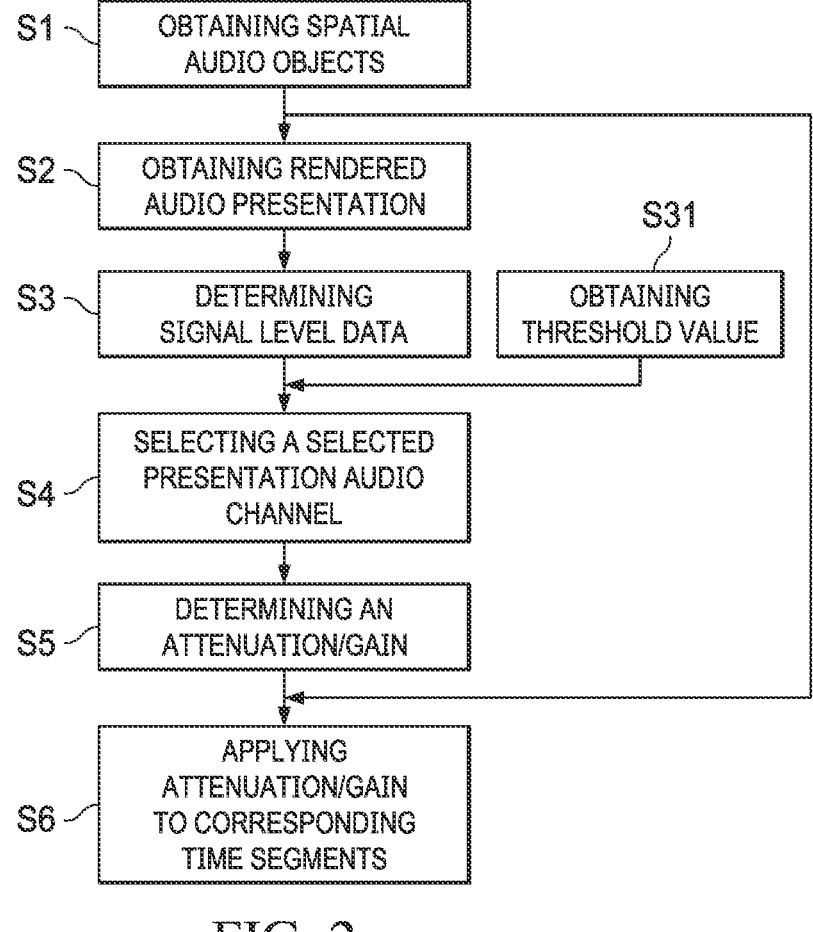
FIG. 2 is flowchart illustrating a method for performing dynamic range adjustment of spatial audio objects, according to some implementations.
Figure 5:
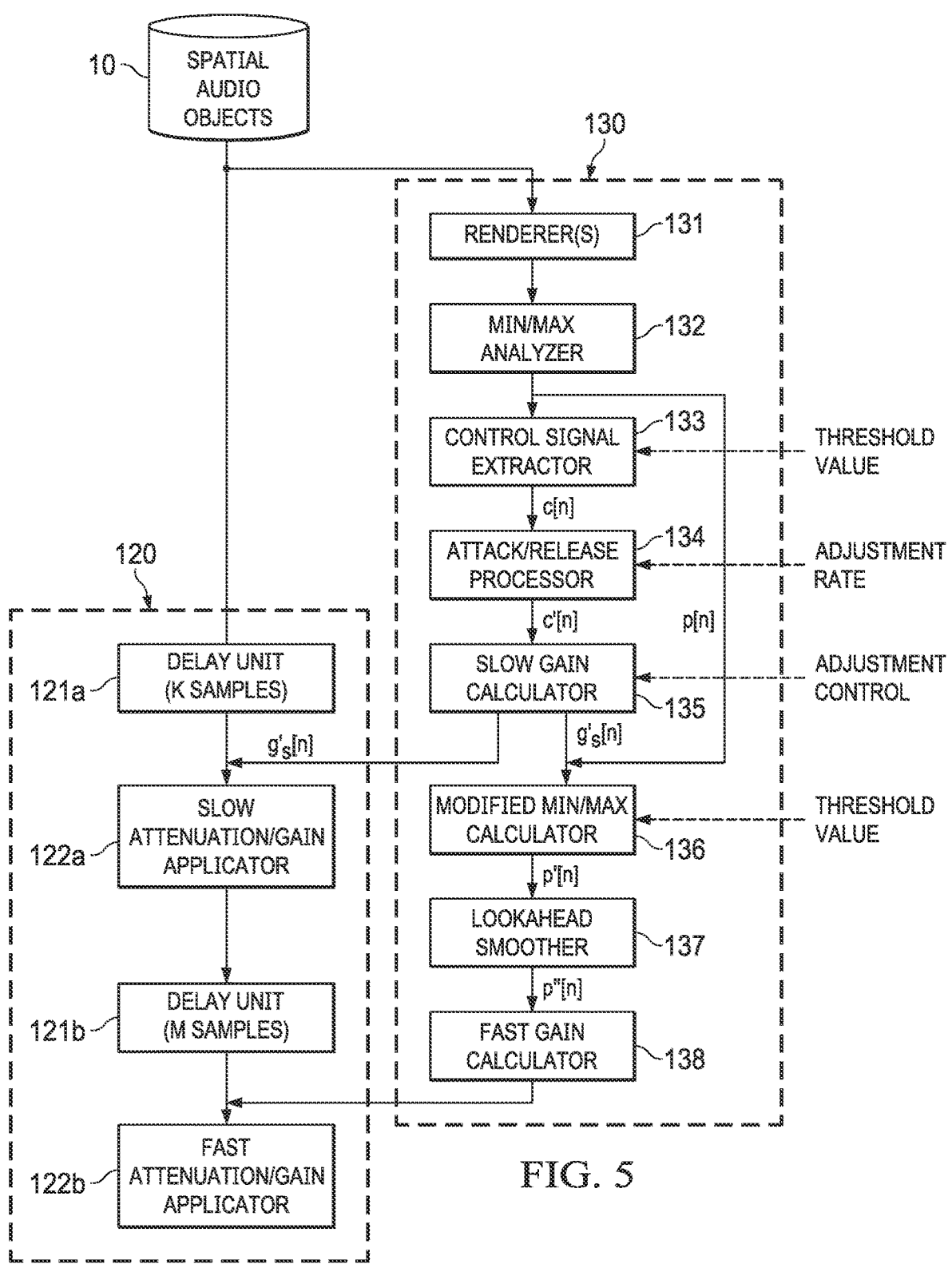
FIG. 5 is a block diagram illustrating an audio processing system for performing dynamic range adjustment of spatial audio objects with a fast gain and a slow gain computed in the side-chain, according to some implementations.

FIG. 5 depicts a variation of the audio processing system in FIG. 1. The side-chain 130 in FIG. 5 comprises the calculation and application of a slow gain and/or a fast gain. The slow gain is changing relatively slowly over time whereas the fast gain is changing more rapidly over time. Calculating and applying both fast and slow gains has proven to be an effective method for eliminating digital "overs" wherein digital "overs" mean e.g. signal levels above the maximum digital audio sample that can be represented by a digital system.

For both the slow gain and the fast gain, the renderer(s) 131 receives the spatial audio objects 10 and renders the spatial audio objects 10 to at least one audio presentation. The at least one rendered audio presentation is provided to the signal level analyzer which e.g. is a min/max analyzer 132 which extracts the minimum or maximum signal level for each time segment across all presentation audio channels. Alternatively, the min/max analyzer 132 is replaced with an average signal analyzer which extracts the average signal level across all presentation channels or e.g. the average signal level of the highest/lowest presentation channel in each rendered presentation.

In the foregoing example, the min/max analyzer 132 will be assumed to be a peak analyzer configured to determine the peak signal value p[n] across the presentation audio channels which enables the audio processing system to perform peak limiting and/or downward compression of the spatial audio objects. However, the examples apply analogously for a min/max analyzer 132 configured to determine an average signal level across two or more presentation channels. Additionally or alternatively, the min/max analyzer 132 may be configured to determine presentation channel being associated with a lowest signal level min[n] which enables the audio processing system to perform e.g. upwards compression (such as bottom limiting) or downward expansion, such as silencing of time segments with a minimum or average signal level below the threshold level.

The peak analyzer determines the peak signal value p[n] as $$p[n] = \max_{j,k} |s_{j,k}[n]| \tag{Eq. 2}$$

for each time segment.

For calculation of the slow gain $g_s[n]$, the peak signal value p[n] of each time segment is provided to a control signal extractor 133 which is configured to extract a control signal c[n] for each time segment given the peak signal value p[n] and the threshold value T. In one implementation, the control signal extractor 133 calculates the control signal as $$c[n] = \begin{cases} \dfrac{p[n]}{T} - 1 & \text{if } p[n] > T \\ 0 & \text{otherwise} \end{cases} \tag{Eq. 3}$$

meaning that the control signal c[n] will be zero if none of the presentation channels exceeds the threshold value T. The control signal c[n] is used by the slow gain calculator 135 to calculate the slow gain $g_s[n]$ to be applied to the spatial audio objects 10 by the slow gain applicator 122a.

Optionally, the control signal extractor 133 is followed by an attack/release processor 134 tasked with modifying the control signal c[n] to maintain a predetermined attenuation/gain adjustment rate. The attack/release processor 134 obtains an adjustment rate parameter, indicating a maximum rate of change (i.e. the derivative) for the applied attenuation/gain between two adjacent time segments and creates a modified control signal c'[n] configured such that the resulting attenuation/gain changes with a maximum rate of change indicated by the adjustment rate parameter.

In some implementations, the adjustment rate parameter is at least a first and second adjustment rate parameter wherein the first adjustment rate parameter indicates an attack time constant $t_a$ and wherein the second adjustment rate parameter indicates a release time constant $t_r$. With the attack and release time constants $t_a$, $t_r$ an attack coefficient, $\alpha$, and a release coefficient, $\beta$, can be obtained as $$\alpha = e^{-\frac{1}{t_a f_s}} \tag{Eq. 4}$$

$$\beta = e^{-\frac{1}{t_r f_s}} \tag{Eq. 5}$$

where $f_s$ is the sampling rate of the rendered audio presentation and/or spatial audio objects 10. Subsequently, a modified control signal c'[n] is calculated by the attack/release processor 134 as $$c'[n] = \begin{cases} \alpha c'[n-1] + (1-\alpha)c[n] & \text{if } c[n] > c'[n] \\ \beta c'[n-1] + (1-\beta)c[n] & \text{otherwise} \end{cases} \quad \text{(Eq. 6)}$$

The slow gain $g_s[n]$ is now calculated by the slow gain calculator 135 using c'[n] from the attack/release processor 134 as $$g_s[n] = \frac{1}{1+c'[n]} \quad \text{(Eq. 7)}$$

or alternatively, c'[n] is replaced with c[n] if the optional attack/release processing at 134 is omitted. Moreover, it is noted that while the extraction of the control signal c[n] is convenient for the description of the extraction of the slow gain, it is not necessary to extract the control signal explicitly. As seen in equation 3, there is a direct link between the peak levels p[n] and the control signal c[n] meaning that c[n] may always be replaced with a function depending on p[n].

The slow gain $g_s[n]$ is provided to the slow gain applicator 122a which applies the slow gain to corresponding time segments of the spatial audio objects 10. In some implementations, the slow gain calculator 122a obtains an adjustment control parameter ρ which indicates to which extent the slow gain $g_s[n]$ is to be applied. For instance, the adjustment control parameter ρ lies in the interval 0≤ρ≤1 and may be fixed or set by the user (e.g. a mastering engineer). The slow gain calculator 122a calculates a partial slow gain g'$_s$[n] based on the control signal c[n] or c'[n] and the adjustment control parameter ρ and provides partial slow gains g'$_s$[n] to the to the slow gain applicator 122a of the main-chain 120 which applies the partial slow gain g'$_s$[n] to the spatial audio objects 10. For instance, the partial slow gain g'$_s$[n] is calculated as $$g'_s[n] = \frac{1}{1+\rho c'[n]} \quad \text{(Eq. 8)}$$

or alternatively the partial slow gain g'$_s$[n] is calculated as $$g'_s[n] = \frac{1}{1+c'[n]}\rho + (1-\rho) \quad \text{(Eq. 9)}$$

wherein c'[n] may be replaced with c[n] if the attack/release processing at 134 is omitted.

In another not shown implementation, the attack/release processor 134 operates on the slow gain $g_s[n]$ or g'$_s$[n] which have been extracted without attack/release processing wherein the attack release processor 134 is configured to perform attack/release processing on the gains $g_s[n]$ or g'$_s$[n] directly as opposed to performing attack/release processing on the control signal c[n].

The slow gain $g_s[n]$ or partial slow gain g'$_s$[n] is provided to the slow gain applicator 122a which applies the slow gain $g_s[n]$ or partial slow gain g'$_s$[n] to each corresponding time segment (and subband representation) of the spatial audio objects to form dynamic range adjusted spatial audio objects x'$_i$[n].

In some implementations, the calculation and application of a slow gain $g_s[n]$ is accompanied by the subsequent calculation and application of a fast gain $g_f[n]$. Alternatively, only one of the fast gain $g_f[n]$ and slow gain $g_s[n]$ is calculated and applied to each time segment of the spatial audio objects. In the below, the fast gain $g_f[n]$ is described in further detail.

With the slow gain $g_s[n]$ (or modified slow gain g'$_s$[n]) calculated by the slow gain calculator 135, the slow gain $g_s[n]$ is provided to the modified min/max calculator 136 alongside the threshold value T and the peak signal levels p[n]. The modified min/max calculator 136 calculates the modified peak levels p'[n], e.g. by setting $$p'[n] = \max\left(0, \frac{p[n]g_s[n]}{T} - 1\right) \quad \text{(Eq. 10)}$$

or by replacing $g_s[n]$ with g'$_s$[n].

The modified peak levels p'[n] are further processed by a lookahead smoother 137 which calculates smoothed modified peak levels p''[n], e.g. by convolving the modified peak levels p'[n] with a smoothing kernel w[m] with m elements. Ideally, the elements of the smoothing kernel w[m] satisfies the unity sum constraint:

$$1 = \Sigma_m w[m] \quad \text{(Eq. 11)}$$

such as w[m]=[0.25, 0.25, 0.25, 0.25]. The fast gain, $g_f[n]$, is then calculated from the smoothed modified peak values as $$g_f[n] = \frac{1}{1+p''[n]} \quad \text{(Eq. 12)}$$

whereby the fast gain $g_f[n]$ is provided to the fast gain applicator 122b which applies the fast gains $g_f[n]$ on the spatial audio objects that have already been processed with the slow gains $g_s[n]$ applied by the slow gain applicator 122a.

In some implementations, the modified peak levels p'[n] are stored in a first cyclic peak buffer $b_1$ of length M $$b_1[m\% M] = p'[n] \quad \text{(Eq. 13)}$$

wherein % indicates the integer modulo operator. A second cyclic buffer $b_2$ of length M stores the maximum peak level observed in the first cyclic peak buffer. Accordingly, the second cyclic peak buffer $b_2$ is obtained as $$b_2[m \% M] = \max_m b_1[m]. \quad \text{(Eq. 14)}$$

The lookahead smoother 137 may be configured to obtain smoothed modified peak levels p''[n] by convolving the smoothing kernel with the second cyclic buffer. That is, the smoothed modified peak levels p''[n] are obtained as $$p''[n] = \Sigma_m w[m] b_2[(n-m)\% M] \quad \text{(Eq. 15)}$$

which are provided to the fast gain calculator 138 which calculates the fast gain $g_f[n]$ in accordance with equation 12 in the above and provides the fast gain $g_f[n]$ to the fast gain applicator 122b.

The amount of lookahead and/or the length of the cyclic buffers $b_1$, $b_2$ can be set by the user as side-chain parameters. Similarly, the length, lookahead and/or individual element values of the smoothing kernel w[m] may be determined by the user as a side-chain parameter to establish the desired dynamic range adjusted spatial audio objects $x'_i[n]$.

Two delay units 121a, 121b of the main-chain 120 are also depicted in FIG. 5, the delay units 121a, 121b are configured to introduce a respective delay to the spatial audio objects 10 such that the fast gain $g_f[n]$ and slow gain $g_s[n]$ are applied for the corresponding time segments. An initial delay of K time segments (e.g. K samples) is applied to the spatial audio objects 10 by the first delay unit 121a to compensate for any rendering delay or lookahead introduced by the renderer(s) 131, min/max analyzer 132, control signal extractor 133, attack/release processor 134, and slow gain calculator 135. Similarly, a second delay unit 121b applies a second delay of M time segments (e.g. M samples) to compensate for any lookahead or delay introduced by the modified min/max calculator 136, lookahead smoother 137 and fast gain calculator 138. The delays K and M introduced by the delay units 121a, 122b is typically in the range of tens to thousands of time segments (samples). For instance, the delay K introduced by the first delay unit 121a is between tens and thousands of time segments (samples) depending on the type of presentation(s) output by the renderer(s) 131 as described in the above. The delay M introduced by the second delay unit 121b is typically in the order of 1 millisecond to 5 milliseconds due mainly to the amount of lookahead in the lookahead smoother 137. For example, for 1 millisecond lookahead at 32 kHz sampled audio channels the delay M is 32 time segments (samples) and for 5 millisecond lookahead at 192 kHz sampled audio channels the delay M is around one thousand time segments (samples).

In one particular implementation, the renderer(s) 131 is an Object Audio Renderer (OAR) employing lightweight preprocessing and a delay of K=512 time segments (samples) is used with a fast gain delay of M=64 for lookahead. If the lightweight preprocessing is replaced with Spatial Coding the delay K could be increased to e.g. 1536, however it is envisaged that with different and/or future pre-processing schemes and OAR rendering techniques the delay K could be reduced below 1536 and even approach or reach a delay of zero time segments (samples). Accordingly, the dynamic range adjusted spatial audio objects $x'_i[n]$ may be obtained as $$x'_i[n]=x_i[n-M-K]g_f[n-K]g_s[n-M-K] \qquad \text{(Eq. 16)}$$

or optionally with $g'_s[n-M-K]$ replacing $g_s[n-M-K]$.

Figure 6:
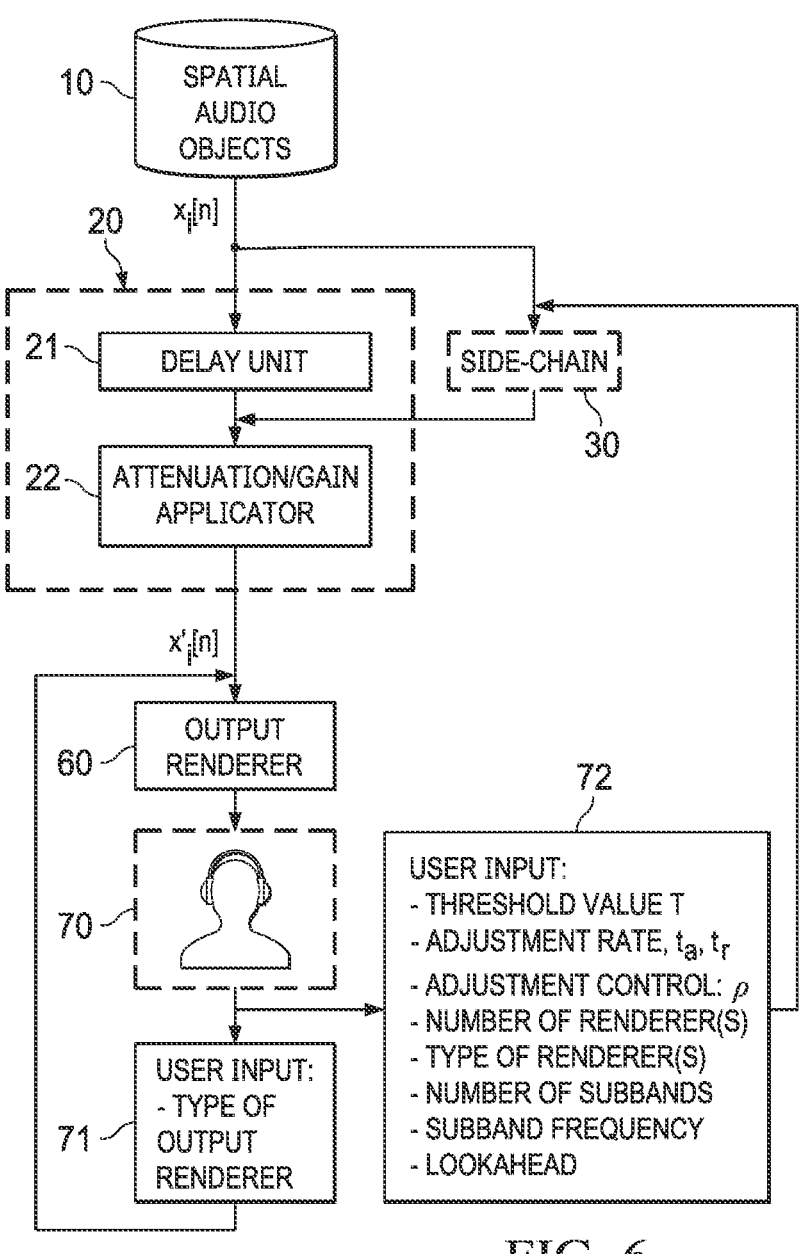
FIG. 6 is a block diagram illustrating a user manipulating output renderer parameters and/or side-chain parameters to modify the dynamic range adjustments imposed by the audio processing system, according to some implementations.

FIG. 6 illustrates a user 70, such as a mastering or mixing engineering, mastering the spatial audio objects 10 using an audio processing system described in the above. The delay unit(s) 21 and the attenuation/gain applicator 22 form a main-chain 20 and involves applying one or more of the fast gain $g_f[n]$ and slow gain $g_s[n]$ in one or more subband representations as described in the above. Similarly, the side-chain 30 is any of the different side-chain implementations described in the above.

When mastering spatial audio objects 10, the user 70 may set or adjust side-chain parameters 72 comprising one or more of the threshold value T (which may be a single value or set per subband representation or per rendered presentation in the side-chain), the adjustment rate (the maximum rate of change or the attack/release times $t_a$, $t_r$), the adjustment control parameter $\rho$, the number of renderers in the side-chain 30, the type of renderers in the side-chain 30, the number and/or frequency (cutoff, bandwidth) of the subband representations in the side-chain 30, and the amount of lookahead e.g. in the lookahead smoother 137. Albeit the main-chain 20 operates with some delay introduced by the delay unit(s) 21, any changes made to the side-chain parameters 72 by the user 70 will introduce a corresponding change in the dynamic range adjusted spatial audio objects $x'_i[n]$ output by the main-chain 20. The dynamic range adjusted spatial audio objects $x'_i[n]$ are rendered to one or more audio presentation(s) of choice (such as a stereo presentation and/or a 5.1 presentation) by the output renderer 60 which is auditioned by the user 70. Accordingly, the user 70 can adjust the side-chain parameters 72 and rapidly hear the results of the tuning to facilitate obtaining the desired result (i.e. mastered spatial audio objects). In some implementations, the output renderer 60 renders dynamic range adjusted spatial audio objects $x'_i[n]$ to two or more presentations in parallel, allowing the user 70 to rapidly switch between different rendered presentation while tuning the side-chain parameters 72. To this end, the user may adjust output renderer parameters 60 which affects the number and type of output renderers (and which presentation that is currently provided to audio system used by the user 70).

The renderer(s) in the side-chain 30 and their respective output presentations may be set based on different criteria highlighted in the below.

The renderer(s) in the side-chain 30 and their output presentation format(s) may be set by input by the user 70.

The renderer(s) in the side-chain 30 and their output presentation format(s) may be selected so as to cover one or more presentations that are expected to be the most common presentations for consumption of the content of the spatial audio objects 10. For instance, if the content is music, the renderer(s) in the side-chain 30 are configured to render a stereo presentation, and if the content is the audio track of a movie, the renderer(s) in the side-chain 30 are configured to render a stereo presentation and a 5.1 presentation.

The renderer(s) in the side-chain 30 and their output presentation format(s) may be selected to represent the worst case situation in terms of risk of digital overs. For instance, the presentation format(s) with the highest peak levels are selected among two or more alternative presentation formats.

The renderer(s) in the side-chain 30 and their output presentation format(s) may be selected to represent all or substantially all of a number of possible renderer(s) and presentation format(s) that will be used in content consumption. Accordingly, the dynamic range adjusted spatial audio objects $x'_i[n]$ ensures that no presentation of the spatial audio objects will have any overs.

The renderer(s) in the side-chain 30 and their output presentation format(s) may be selected based on the sonic characteristics that a presentation introduces into the dynamic range adjusted spatial audio objects $x'_i[n]$ outputted by the main-chain 20 (and which is apparent from the presentation outputted by the output renderer 60). The sonic characteristics comprises at least one of: an amount of perceived punch, clarity, loudness, harmonic distortion or saturation, intermodulation distortion, transient squashing or enhancement or dynamics enhancement. For instance, the user 70 cycles through various presentation format(s) in the side-chain 30 to determine which presentation formats provides the best basis for analyzing the modification of the sonic characteristics introduced by the application of the attenuation/gain introduced by the side-chain 30.

Unless specifically stated otherwise, as apparent from the following discussions, it is appreciated that throughout the disclosure discussions utilizing terms such as "processing", "computing", "calculating", "determining", "analyzing" or the like, refer to the action and/or processes of a computer hardware or computing system, or similar electronic computing devices, that manipulate and/or transform data represented as physical, such as electronic, quantities into other data similarly represented as physical quantities.

It should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention. Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Note that when the method includes several elements, e.g., several steps, no ordering of such elements is implied, unless specifically stated. Furthermore, an element described herein of an apparatus embodiment is an example of a means for carrying out the function performed by the element for the purpose of carrying out the invention. In the description provided herein, numerous specific details are set forth. However, it is understood that embodiments of the invention may be practiced without these specific details. In other instances, well-known methods, structures and techniques have not been shown in detail in order not to obscure an understanding of this description.

Thus, while there has been described specific embodiments of the invention, those skilled in the art will recognize that other and further modifications may be made thereto without departing from the spirit of the invention, and it is intended to claim all such changes and modifications as falling within the scope of the invention. For example, the different alternatives for determination and application of the fast gain $g_f[n]$ and slow gain $g_s[n]$ described in combination with FIG. 5 could be performed in parallel for two or more subband representations (as described in connection with FIG. 4 above) and/or across presentation audio channels from two or more rendered presentations (as described in connection with FIG. 3 in the above). Additionally, the min/max analyzer 132 in FIG. 5 may be comprised in the signal level analyzer 32, 32a, 32b, 32c of FIG. 1, FIG. 3 and FIG. 4. Similarly, the control signal extractor 331, attack/release processor 333, and slow gain calculator 334 of FIG. 5 may be comprised in the attenuation/gain calculator 33, 33a, 33b, 33c of FIG. 1, FIG. 3 and FIG. 4.

Various features and aspects will be appreciated from the following enumerated exemplary embodiments ("EEEs"):

EEE 1. A method for dynamically changing levels of one or more object-based audio signals of an object-based input audio asset, wherein the method comprises: receiving the object-based input audio asset; rendering the object-based input audio asset to one or more presentations using one or more audio renderers; determining one or more measures of signal level of the one or more presentations; computing a gain or an attenuation in response to the one or more signal level measures; and applying the computed gain or attenuation to at least one of the one or more object-based audio signals to produce an object-based output audio asset.

EEE 2. The method of EEE 1, wherein rendering the object-based input audio asset to the one or more presentations comprises generating one or more loudspeaker or headphones presentations.

EEE 3. The method of EEE 1 or 2, wherein determining the one or more measures of signal level comprises detecting a peak signal level or an average signal level.

EEE 4. The method of any of EEEs 1-3, wherein the attenuation is based on a control signal determined from the one or more measured signal levels.

EEE 5. The method of any of EEEs 1-4, wherein the computed gain or attenuation is configured to reduce peak levels in one or more rendered presentations.

EEE 6. The method of any of EEEs 1-5, wherein the computed gain or attenuation is based on a desired input-output curve.

EEE 7. The method of any of EEEs 1-6, further comprising modifying one or more parameters for rendering the object-based input audio asset, for determining one or more measures of signal level, for computing the gain or the attenuation, and/or for auditioning the object-based output audio asset in real-time.

EEE 8. The method of EEE 7 when dependent on EEE 4, further comprising modifying one or more parameters for computing the control signal.

EEE 9. The method of any of EEEs 1-7, wherein rendering the object-based input audio asset to the one or more presentations using the one or more audio renderers comprises: converting the object-based input audio asset into one or more presentations in a frequency invariant manner.

EEE 10. The method of EEE 9, wherein the converting is applied in two or more frequency bands of the object-based input audio asset.

EEE 11. The method of any of EEEs 1-10, wherein computing the gain or the attenuation in response to the one or more signal level measures is based on at least one control parameter, the one control parameter comprising at least one of an attack time constant, a release time constant, a maximum amplitude, a threshold, or a proportion of gain or attenuation to be applied.

EEE 12. The method of any of EEEs 1-11, wherein computing the gain or the attenuation in response to the one or more signal level measures comprises computing a fast gain and a slow gain.

EEE 13. The method of EEE 12, wherein computing the fast gain and/or the slow gain is based on at least one control parameter, the one control parameter comprising at least one of an attack time constant, a release time constant, a maximum amplitude, a threshold, or a proportion of gain or attenuation to be applied.

EEE 14. The method of any of EEEs 1-13, wherein the one or more audio renderers and one or more respective output presentation formats of the one or more audio renderers are configured to be selected based a criteria, the criteria comprising at least one of: (a) an end-user input, (b) an end-user preference, (c) a likelihood of one or more presentations being consumed by a listener, (d) a worst-case scenario of expected peak levels across two or more alternatives, (e) running a plurality of the one or more audio renderers and/or the one or more respective output presentation formats in parallel to ensure that the one or more respective output presentations has peak levels above a threshold value, or (f) an end-user selection from a plurality of options to obtain a specific sonic character.

EEE 15. The method of EEE 14, wherein the plurality of options includes at least one of: a specific amount of perceived punch, clarity, loudness, harmonic distortion or saturation, intermodulation distortion, transient squashing or dynamics enhancement.

EEE 16. A system for dynamically changing signal levels of one or more object-based audio signals of an object-based input audio asset, wherein the system comprises: one or more renderers, the one or more renderers configured to: receive the object-based input audio asset; render the object-based input audio asset to one or more presentations; and a peak analyzer configured to: determine one or more measures of signal level of the one or more presentations; a gain analyzer configured to: compute a gain or an attenuation in response to the one or more signal level measures; and wherein the computed gain or attenuation is applied to at least one of the one or more object based audio signals to produce an object-based output audio asset.

EEE 17. The system of EEE 16, further comprising a delay unit configured to compensate for one or more latencies introduced by the one or more renderers.

EEE 18. The system of EEE 17, wherein the one or more renderers comprise at least two renderers operating in parallel.

EEE 19. The system of EEE 18, wherein the peak analyzer is further configured to compute a control signal derived from the output of the at least two renderers operating in parallel.

EEE 20. The system of EEE 19, wherein the gain analyzer is configured to compute the gain or the attenuation in response to the one or more signal level measures based on the computed control signal.

The invention claimed is:

1. A method for performing dynamic range adjustment of spatial audio objects, the method comprising:

obtaining a plurality of spatial audio objects;

obtaining at least two different rendered audio presentations of the spatial audio objects, each of the at least two rendered audio presentations comprising at least one presentation audio channel forming a set of presentation audio channels;

determining signal level data associated with each presentation audio channel in said set of presentation audio channels, wherein the signal level data represents a signal level for a plurality of time segments of the presentation audio channel;

obtaining a threshold value;

for each time segment:

selecting a selected presentation audio channel, wherein the selected presentation audio channel is a presentation audio channel of the set of presentation audio channels that is associated with a highest signal level or a lowest signal level for the time segment compared to other presentation audio channels of said set of presentation audio channels, and determining a gain, the gain being based on the threshold value and a representation of the signal level of the selected audio channel; and applying the gain of each time segment to corresponding time segments of each spatial audio object to form dynamic range adjusted spatial audio objects.

2. The method according to claim 1, further comprising:

obtaining an adjustment ratio coefficient; and wherein determining for each time segment a gain comprises:

determining a threshold difference, the threshold difference being a difference between the threshold value and the signal level representation of the selected audio channel; and determining the gain based on the threshold difference and the adjustment ratio coefficient.

3. The method according to claim 1, wherein the gain attenuates the signal level of the selected presentation channel to said threshold value or wherein the gain amplifies the signal level of the selected presentation channel to said threshold value.

4. The method according to claim 3, further comprising obtaining an adjustment control parameter, wherein the adjustment control parameter indicates a scaling factor of the gain; and applying the scaling factor to the gain.

5. The method according to claim 1, wherein the signal level data for each time segment comprises a signal level representation for a plurality of frequency bands of the presentation audio channel, the method further comprising:

selecting, for each time segment and frequency band, a presentation audio channel of said set of presentation audio channels;

determining a gain for each time segment and frequency band, the gain for each frequency band being based on the threshold value and the representation of the time segment and frequency band of the signal level of the selected presentation audio channel; and applying the gain of each frequency band and time segment to corresponding time segments and frequency bands of each spatial audio object to form dynamic range adjusted spatial audio objects.

6. The method according to claim 1, wherein each rendered audio presentation comprises at least two presentation audio channels.

7. The method according to claim 1, wherein the gain is further based on a representation of the signal level of a second selected audio channel, wherein a second selected presentation audio signal is of a second rendered presentation different from the rendered presentation of the selected audio channel.

8. The method according to claim 7, further comprising obtaining a second threshold value for each of said at least two rendered presentations;

wherein the gain is further based on a combination of:

the representation of the signal level of the selected audio signal and the threshold value, and the representation of the signal level of the second selected audio channel and the second threshold value.

9. The method according to claim 1, further comprising:

obtaining an adjustment rate parameter, indicating a maximum rate of change for the gain between two adjacent time segments, and wherein the gain is further based on the adjustment rate parameter such that the gain changes with a maximum rate of change indicated by the adjustment rate parameter.

10. The method according to claim 9, wherein the adjustment rate parameter is at least a first and a second adjustment rate parameter, wherein the first adjustment rate parameter indicates an attack time constant, wherein the second adjustment rate parameter indicates a release time constant, and wherein the gain is further based on the attack time constant and the release time constants such that the gain changes with a maximum rate of change indicated by the attack time constant and the release time constants respectively.

11. The method according to claim 1, further comprising:

determining, for each time segment, a modified signal level representation, wherein the modified signal level representation is based on the signal level representation of the selected presentation audio channel with the gain applied;

determining a smoothed modified signal level representation for each time segment by convolving the modified signal level representation of each time segment with a smoothing kernel;

calculating a smoothing gain based on the smoothed modified signal level representation for each time segment; and applying the smoothing gain of each time segment to a corresponding time segment of each dynamic range adjusted spatial audio object to form enhanced dynamic range adjusted spatial audio objects.

12. The method according to claim 11, further comprising:

storing the modified signal level representation of consecutive time segments in a first cyclic buffer of length M; and storing a maximum or a minimum modified signal level representation of the first cyclic buffer in a second cyclic buffer of length M;

wherein determining a smoothed modified signal level representation for each time segment comprises convolving the second cyclic buffer with the smoothing kernel.

13. The method according to claim 1, wherein said representation of signal level of each time segment of each presentation audio channel is chosen from a group comprising:

an RMS representation of the signal level of the time segment, an amplitude of the time segment, a maximum amplitude of the time segment, an average amplitude of the time segment, and a minimum amplitude of the time segment.

14. The method according to claim 1, wherein each rendered presentation is a rendered presentation chosen from a group comprising:

a mono presentation, a stereo presentation, a binaural presentation, a 5.1 presentation, a 7.1 presentation, a 5.1.2 presentation, a 5.1.4 presentation, a 7.1.2 presentation, a 7.1.4 presentation, a 9.1.2 presentation, a 9.1.4 presentation, a 9.1.6 presentation, and a multichannel presentation with at least three height levels, such as 22.2.

15. A non-transitory computer-readable medium storing instructions which, when the instructions are executed by a computer, cause the computer to carry out the steps of the method of claim 1.

16. An audio processing system for dynamic range adjustment, comprising:

at least two renderers, each of the at least two renderers configured to obtain a plurality of spatial audio objects and render the spatial audio objects to a respective different rendered presentation, each rendered presentation comprising at least one presentation audio channel forming a set of rendered presentation audio channels;

a signal level analysis unit, configured to determine signal level data associated with each presentation audio channel in said set of presentation audio channels, wherein the signal level data represents the signal level for a plurality of time segments of the presentation audio channel, and a gain calculator, configured to:

obtain a threshold value, select a presentation audio channel, wherein the selected presentation audio channel is a presentation audio channel of the set of presentation audio channels which is associated with a highest or a lowest signal level representation for the time segment compared to the other presentation audio channels of said set of presentation audio channels, determine for each time segment a gain, the gain being based on the threshold value and the signal level representation of the selected presentation audio channel, and a gain applicator configured to apply the gain of each time segment to corresponding time segments of each spatial audio object to form dynamic range adjusted spatial audio objects.

17. The audio processing system according to claim 16, further comprising:

a delay unit configured to obtain the plurality of spatial audio objects and generate delayed spatial audio objects corresponding to the spatial audio objects, wherein the delay introduced by the delay unit corresponds to the delay introduced by the at least one renderer, and wherein the gain applicator is configured to apply the gain of each time segment to corresponding time segments of each delayed spatial audio object to form dynamic range adjusted spatial audio objects.

18. The audio processing system according to claim 16, wherein each rendered presentation comprises at least two presentation audio channels.

* * * * *